(12) United States Patent
Lin et al.

(10) Patent No.: US 10,783,831 B2
(45) Date of Patent: Sep. 22, 2020

(54) PIXEL CIRCUIT, DISPLAY PANEL, DISPLAY DEVICE, AND METHOD OF DRIVING PIXEL CIRCUIT

(71) Applicant: BOE TECHNOLOGY GROUP CO., LTD., Beijing (CN)

(72) Inventors: Yicheng Lin, Beijing (CN); Pan Xu, Beijing (CN); Guang Yan, Beijing (CN); Dongfang Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/413,645

(22) Filed: May 16, 2019

(65) Prior Publication Data
US 2020/0058253 A1 Feb. 20, 2020

(30) Foreign Application Priority Data
Aug. 17, 2018 (CN) .......................... 2018 1 0940864

(51) Int. Cl.
*G09G 3/3258* (2016.01)
*H05B 45/10* (2020.01)
*H01L 27/32* (2006.01)

(52) U.S. Cl.
CPC ......... *G09G 3/3258* (2013.01); *H01L 27/326* (2013.01); *H05B 45/10* (2020.01)

(58) Field of Classification Search
CPC ............... G09G 3/3258; G09G 3/3233; G09G 2310/0262; G09G 2360/148; G09G 2360/14; G09G 2360/142; G09G 2360/147
See application file for complete search history.

(56) References Cited

U.S. PATENT DOCUMENTS

2013/0043796 A1\* 2/2013 Ko ........................ G09G 3/3233
315/151
2015/0103037 A1\* 4/2015 Wu ......................... G06F 3/041
345/174
(Continued)

FOREIGN PATENT DOCUMENTS

CN 104021773 A 9/2014
CN 104465715 A 3/2015
(Continued)

OTHER PUBLICATIONS

First Office Action for Chinese Patent Application No. 201810940864.X dated Sep. 29, 2019.

*Primary Examiner* — Dennis P Joseph
(74) *Attorney, Agent, or Firm* — Calfee, Halter & Griswold LLP (57) ABSTRACT

A pixel circuit comprising an organic light emitting diode; a driving transistor including a gate, a source connected to a first node, a drain connected to a second power supply terminal; and a photosensitive circuit connected between a second node and a third node, the second node configured to receive a reference voltage. The driving transistor is configured to, responsive to a gate voltage and a source voltage, control a magnitude of a driving current flowing through the organic light emitting diode. The photosensitive circuit is configured to sense an intensity of light emission of the organic light emitting diode and to set a potential at the third node according to the reference voltage and the intensity that was sensed, the potential that was set being detectable by an external circuit via a sense line.

20 Claims, 4 Drawing Sheets

(56) References Cited

U.S. PATENT DOCUMENTS

| | | | |
|---|---|---|---|
| 2015/0268763 A1* | 9/2015 | Zhou | G09G 3/3208 345/174 |
| 2016/0098961 A1 | 4/2016 | Han et al. | |
| 2016/0189606 A1 | 6/2016 | Chen et al. | |
| 2016/0247445 A1 | 8/2016 | Zhang | |
| 2016/0253541 A1 | 9/2016 | Yang et al. | |
| 2018/0211601 A1 | 7/2018 | Chen et al. | |
| 2019/0067384 A1 | 2/2019 | Zou | |
| 2019/0147797 A1 | 5/2019 | Yuan et al. | |
| 2019/0164493 A1 | 5/2019 | Liu et al. | |

FOREIGN PATENT DOCUMENTS

| | | | |
|---|---|---|---|
| CN | 105489159 A | 4/2016 | |
| CN | 106504703 A | 3/2017 | |
| CN | 107546337 A | 1/2018 | |
| CN | 107657923 A | 2/2018 | |
| CN | 107863065 A | 3/2018 | |
| CN | 108109588 A | 6/2018 | |

* cited by examiner

PIXEL CIRCUIT, DISPLAY PANEL, DISPLAY DEVICE, AND METHOD OF DRIVING PIXEL CIRCUIT

CROSS-REFERENCE TO RELATED APPLICATIONS

This application claims priority to Chinese Patent Application No. 201810940864.X, filed on Aug. 17, 2018, the entire disclosure of which is hereby incorporated by reference.

TECHNICAL FIELD

The present disclosure relates to the field of display technologies, and in particular, to a pixel circuit, a display panel, a display device, and a method of driving a pixel circuit.

BACKGROUND

In a pixel circuit of an organic light emitting diode (OLED) display, a display function is implemented by a driving transistor controlling a driving current flowing through the OLED. The magnitude of the driving current is related to a number of characteristic parameters including the threshold voltage of the driving transistor. Various compensation techniques have been developed to avoid display defects resulting from drift of the characteristic parameters of the driving transistor.

The compensation approaches may include internal compensation and external compensation. External compensation refers to an approach in which electrical or optical characteristics of a pixel are perceived by an external driving circuit or device and then compensated. External compensation may require additional specialized equipment, such as a CCD camera, to perform the perception of the optical characteristics.

SUMMARY

In an exemplary embodiment, a pixel circuit is provided, comprising: an organic light emitting diode connected between a first node and a first power supply terminal; a driving transistor comprising a gate, a source connected to the first node, and a drain connected to a second power supply terminal; and a photosensitive circuit connected between a second node and a third node, the second node configured to receive a reference voltage. The driving transistor is configured to, responsive to a gate voltage at the gate and a source voltage at the source, control a magnitude of a driving current flowing through the organic light emitting diode, the gate voltage being controllable to be equal to the reference voltage received at the second node, the source voltage being controllable to be equal to a data voltage supplied to the pixel circuit via a data line. The photosensitive circuit is configured to sense an intensity of light emission of the organic light emitting diode and to set a potential at the third node according to the reference voltage and the intensity that was sensed, the potential that was set being detectable by an external circuit via a sense line.

In some exemplary embodiments, the pixel circuit further comprises: a first transistor configured to bring the gate of the driving transistor into conduction with the second node in response to a first scan signal on a first scan line being active; and a second transistor configured to bring the source of the driving transistor into conduction with the data line in response to the first scan signal on the first scan line being active.

In some exemplary embodiments, the photosensitive circuit comprises: a photodiode connected between the second node and the third node; and a first capacitor connected between the second node and the third node.

In some exemplary embodiments, the pixel circuit further comprises a third transistor configured to bring the third node into conduction with the sense line in response to a second scan signal on a second scan line being active.

In some exemplary embodiments, the pixel circuit further comprises a second capacitor connected between the gate and the source of the driving transistor.

According to another exemplary embodiment, a display panel is provided, comprising a plurality of pixels arranged in an array. Each of the plurality of pixels comprises the pixel circuit as described above.

According to yet another exemplary embodiment, a display device is provided, comprising:

a first scan driver configured to sequentially supply a first scan signal to a plurality of first scan lines; a second scan driver configured to sequentially supply a second scan signal to a plurality of second scan lines; a data driver configured to generate data voltages based on image data and supply the data voltages that were generated respectively to a plurality of data lines; and a display panel comprising a plurality of pixel circuits arranged in an array, each of the plurality of pixel circuits comprising: an organic light emitting diode connected between a first node and a first power supply terminal; a driving transistor comprising a gate, a source connected to the first node, and a drain connected to a second power supply terminal; and a photosensitive circuit connected between a second node and a third node, the second node configured to receive a reference voltage. The driving transistor is configured to, responsive to a gate voltage at the gate and a source voltage at the source, control a magnitude of a driving current flowing through the organic light emitting diode, the gate voltage being controllable to be equal to the reference voltage received at the second node, the source voltage being controllable to be equal to a corresponding one of the data voltages supplied to the pixel circuit via a corresponding one of the plurality of data lines. The photosensitive circuit is configured to sense an intensity of light emission of the organic light emitting diode and to set a potential at the third node according to the reference voltage and the intensity that was sensed, the potential that was set at the third node being transferred to a corresponding one of a plurality of sense lines. The display device further comprises: a plurality of detection circuits configured to detect respective ones of the potentials that were set, which are transferred by respective ones of the plurality of sense lines; and a timing controller configured to control the first and second scan drivers, the data driver, and the plurality of detection circuits. The timing controller is further configured to compensate image data to be supplied to the data driver based on detection by the plurality of detection circuits.

According to another exemplary embodiment, a method of driving a pixel circuit is provided. The pixel circuit comprises: an organic light emitting diode connected between a first node and a first power supply terminal; a driving transistor comprising a gate, a source connected to the first node, and a drain connected to a second power supply terminal; and a photosensitive circuit connected between a second node and a third node, the second node configured to receive a reference voltage. The method comprising: setting a gate voltage at the gate of the driving transistor to the reference voltage received at the second node; setting a source voltage at the source of the driving transistor to a data voltage supplied to the pixel circuit via a data line; responsive to the gate voltage and the source voltage, controlling, by the driving transistor, a magnitude of a driving current flowing through the organic light emitting diode; sensing, by the photosensitive circuit, an intensity of light emission of the organic light emitting diode; and setting, by the photosensitive circuit, a potential at the third node according to the reference voltage and the intensity that was sensed.

In some exemplary embodiments, the method further comprises transferring the potential that was set at the third node to a sense line.

These and other aspects of the present disclosure will be apparent from and elucidated with reference to the exemplary embodiments described hereinafter.

BRIEF DESCRIPTION OF THE DRAWINGS

Further details, features and advantages of the present disclosure are disclosed in the following description of exemplary embodiments in conjunction with the accompanying drawings in which.

DETAILED DESCRIPTION

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "connected to" or "coupled to" another element, it can be directly connected or coupled to the other element, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Photosensitive circuits and pixel circuits can be used to implement built-in optical and electrical compensation without the use of an external CCD camera. This enables real-time compensation mechanisms for pixel circuits. However, this may also yield undesirable side effects such as increased routings and hence a reduced pixel aperture ratio.

Exemplary embodiments will be described in detail below, which may be used to advantage for various reasons, such as to alleviate or mitigate these undesirable side effects.

Figure 1:
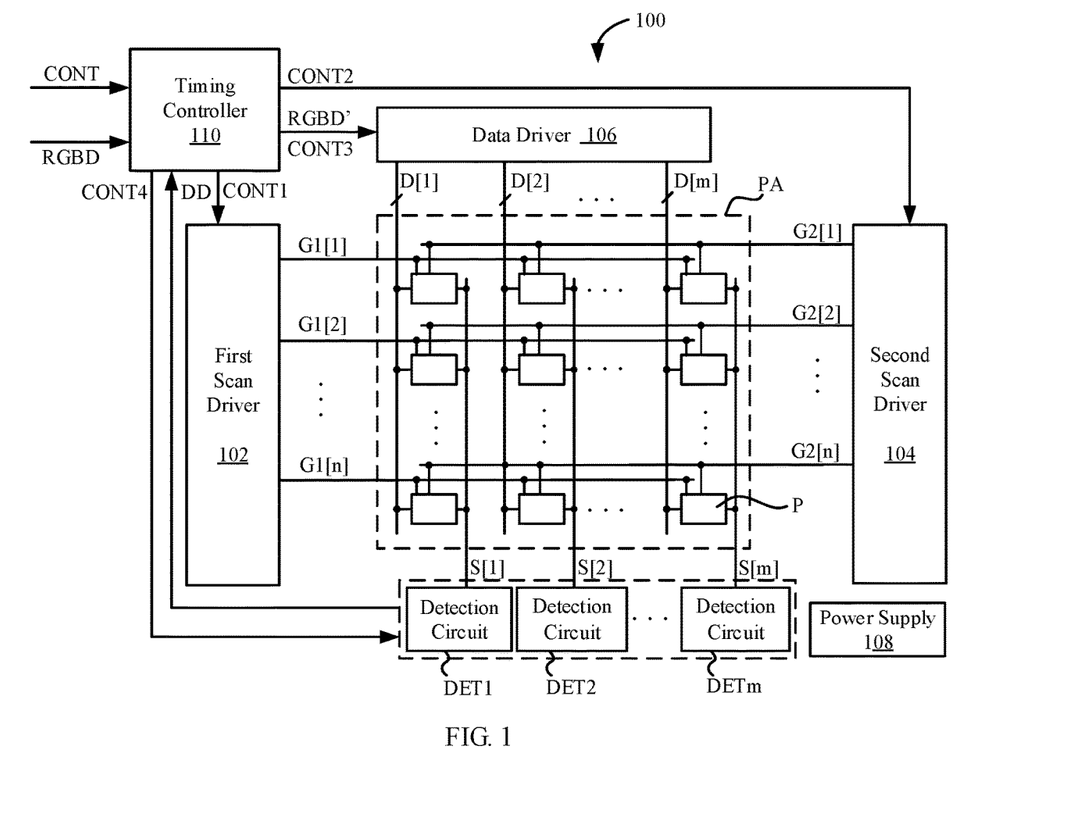
FIG. 1 is a schematic block diagram of a display device in accordance with an exemplary embodiment.

FIG. 1 is a schematic block diagram of a display device 100 in accordance with an exemplary embodiment.

Referring to FIG. 1, the display device 100 includes a display panel PA, a first scan driver 102, a second scan driver 104, a data driver 106, a plurality of detection circuits DET1, DET2, . . . , DETm, a power supply 108, and a timing controller 110. By way of example and not limitation, the display device 100 can be any product or component having a display function, such as a cell phone, a tablet, a television, a display, a notebook, a digital photo frame, a navigator, and the like.

The display panel PA includes n×m pixels P (n and m being natural numbers), n first scan lines G1[1], G1[2], . . . , G1 [n] arranged in a row direction to transfer respective first scanning signals, n second scan lines G2[1], G2[2], . . . , G2[$n$] arranged in the row direction to transfer respective second scanning signals, m data lines D[1], D[2], . . . , D[m] arranged in a column direction to transfer respective data voltages, m sense lines S[1], S[2], . . . , S[m] arranged in the column direction to transfer sense signals from the pixels P, and wires (not shown) for transferring the power supply voltages ELVSS and ELVDD.

The timing controller 110 is used to control the first scan driver 102, the second scan driver 104, the data driver 106, and the detection circuits DET1, DET2, . . . , DETm. The timing controller 110 receives input image data RGBD and input control signals CONT from a system interface, and receives detection data DD from the detection circuits DET1, DET2, . . . , DETm. The input image data RGBD may include a plurality of input pixel data for the plurality of pixels P, and each of the input pixel data may include red grayscale data R, green grayscale data G and blue grayscale data B for a corresponding one of the plurality of pixels P. The input control signals CONT may include a main clock signal, a data enable signal, a vertical sync signal, a horizontal sync signal, and the like. The timing controller 110 generates output image data RGBD', a first control signal CONT1, a second control signal CONT2, a third control signal CONT3, and a fourth control signal CONT4 based on the input image data RGBD, the detection data DD, and the input control signals CONT. The first control signal CONT1 and the second control signal CONT2 are supplied to the first scan driver 102 and the second scan driver 104, respectively, such that the operations of the first and second scan drivers 102 and 104 are controlled based on the first and second control signals CONT1 and CONT2, respectively. The first and second control signals CONT1 and CONT2 may include a vertical enable signal, a gate clock signal, and the like. The third control signal CONT3 and the output image data RGBD' are supplied to the data driver 106, such that the data driver 106 generates data voltages corresponding to the output image data RGBD' based on the third control signal CONT3. The third control signal CONT3 may include a horizontal enable signal, a data clock signal, a data load signal, and the like. The fourth control signal CONT4 is supplied to the detection circuits DET1, DET2, ..., DETm such that the operations of the detection circuits DET1, DET2, ..., DETm are controlled based on the fourth control signal CONT4. For example, the detection circuits DET1, DET2, ..., DETm can be controlled such that the detection is performed upon transferring of the sense signals from the pixels P to the sense lines S[1], S[2], ..., S[m].

Figure 2:
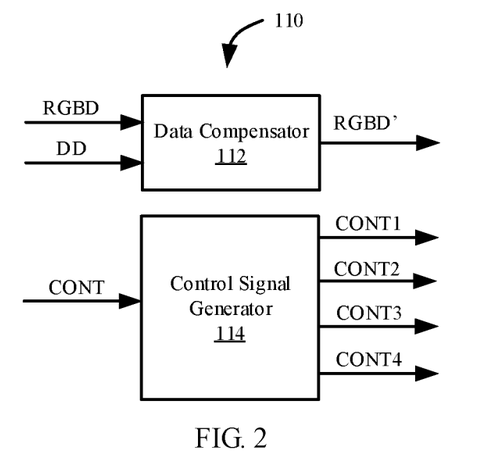
FIG. 2 is a schematic block diagram of a timing controller of the display device shown in FIG. 1.

FIG. 2 is a schematic block diagram of the timing controller 110.

Referring to FIG. 2, the timing controller 110 includes a data compensator 112 and a control signal generator 114. For convenience of description, the timing controller 110 is illustrated in FIG. 2 as being divided into two elements, although the timing controller 110 may not be physically divided.

The data compensator 112 compensates the input image data RGBD based on the detection data DD from the plurality of detection circuits DET1, DET2, ..., DETm to generate compensated output image data RGBD'. For example, values of the sense signals detected in the case where given image data is supplied to the data driver 106 can be compared with ideal values, and compensation values for the image data to be supplied to the data driver 106 can be determined based on the comparison result. In this way, it is possible to allow the pixels P to exhibit ideal brightness corresponding to the original uncompensated image data. This is so-called "external compensation". Specific compensation algorithms are beyond the scope of this document, and any known or future algorithms in the art may be employed herein.

The control signal generator 114 receives the input control signals CONT from the system interface and generates the control signals CONT1, CONT2, CONT3, and CONT4. The control signal generator 114 outputs the control signals CONT1, CONT2, CONT3, and CONT4 to the first scan driver 102, the second scan driver 104, the data driver 106, and the detection circuits DET1, DET2, ..., DETm shown in FIG. 1, respectively.

The timing controller 110 can be implemented in a number of ways (e.g., using dedicated hardware) to perform various functions discussed herein. A "processor" is an example of the timing controller 110 that employs one or more microprocessors that can be programmed using software (e.g., microcode) to perform the various functions discussed herein. The timing controller 110 can be implemented with or without a processor, and can also be implemented as a combination of dedicated hardware that performs some functions and a processor that performs other functions (e.g., one or more programmed microprocessors and associated circuitry). Examples of the timing controller 110 that may be employed in various different exemplary embodiments include, but are not limited to, a conventional microprocessor, an application specific integrated circuit (ASIC), and a field programmable gate array (FPGA).

Referring back to FIG. 1, the first scan driver 102 sequentially generates the plurality of first scan signals based on the first control signal CONT1 and applies them to the first scan lines G1[1], G1[2], ..., G1[n]. The second scan driver 104 sequentially generates the plurality of second scan signals based on the second control signal CONT2 and applies them to the second scan lines G2[1], G2[2], ..., G2[n]. The data driver 106 generates and applies the plurality of data voltages to the data lines D[1], D[2], ..., D[m] based on the third control signal CONT3 and the output image data RGBD'.

The first and second scan drivers 102 and 104 and the data driver 106 can be implemented using any known or future technology. For example, the first and second scan drivers 102 and 104 may each include a plurality of cascaded shift registers, and the data driver 106 may include a shift register, a latch, a digital-to-analog converter, and a buffer. In an embodiment, the first and second scan drivers 102 and 104 and/or the data driver 106 may be disposed on the display panel PA or may be connected to the display panel PA by, for example, a Tape Carrier Package (TCP). For example, the first and second scan drivers 102 and 104 may be integrated in the display panel PA as a gate driver on array (GOA) circuit.

Continuing with the example of FIG. 1, the detection circuits DET1, DET2, DETm are connected to respective ones of the sense lines S[1], S[2], ..., S[m] and receive the fourth control signal CONT4 from the timing controller 110. The detection circuits DET1, DET2, ..., DETm detect the sense signals transferred via the respective ones of the sense lines S[1], S[2], ..., S[m] based on the fourth control signal CONT4. In some examples, the detection circuits DET1, DET2, ..., DETm may comprise respective analog-to-digital converters (ADCs) for converting voltages on the sense lines S[1], S[2], ..., S[m] into digital data DD. The digital data DD can then be transferred to the timing controller 110.

The power supply 108 supplies electric power to the display panel PA, the timing controller 110, the first and second drivers 102 and 104, the data drivers 106, and potentially additional components. For example, the power supply 108 supplies the power supply voltages ELVSS and ELVDD (not shown in FIG. 1) to each of the pixel circuits P in the display panel PA. The configuration of the power supply 108 may be as known in the art. In some examples, the power supply 108 can include a voltage converter such as a DC/DC converter.

Figure 3:
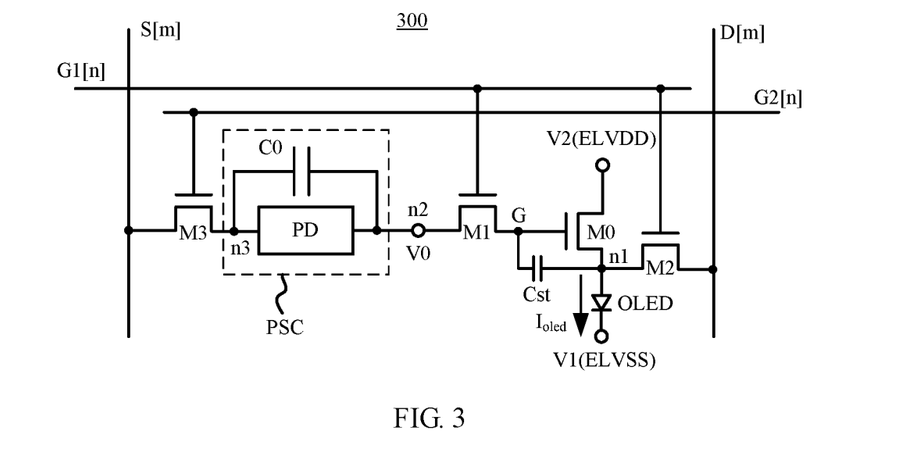
FIG. 3 is a schematic circuit diagram of a pixel circuit in accordance with an exemplary embodiment.

FIG. 3 is a schematic circuit diagram of a pixel circuit 300 in accordance with an exemplary embodiment.

Each of the pixels P shown in FIG. 1 may include the pixel circuit 300. For convenience of description, the pixel circuit 300 is illustrated as being connected to an n-th first scan line G1[n], an n-th second scan line G2[n], an m-th data line D[m], and an m-th sense line S[m]. As shown in FIG. 3, the pixel circuit 300 includes a light emitting diode OLED, a driving transistor M0, and a photosensitive circuit PSC.

The light emitting diode OLED is connected between a first node n1 and a first power supply terminal V1. In this exemplary embodiment, the light emitting diode OLED may be an organic light emitting diode. In other exemplary embodiments, the light emitting diode OLED can be other types of light emitting elements.

The driving transistor M0 is connected between a second power supply terminal V2 and the first node n1. The driving transistor M0 includes a gate a source connected to the first node n1, and a drain connected to the second power supply terminal V2. The driving transistor M0 is configured to, responsive to a gate voltage at the gate G and a source voltage at the source control, a magnitude of a driving current $I_{oled}$ flowing through the light emitting diode OLED. The gate voltage can be controlled to be equal to a reference voltage V0 received at a second node n2. The source voltage can be controlled to be equal to a data voltage supplied to the pixel circuit 300 via the data line D[m].

In this exemplary embodiment, the driving transistor M0 is an N-type transistor, the first power supply terminal V1 is configured to receive the power supply voltage ELVSS, and the second power supply terminal V2 is configured to receive the power supply voltage ELVDD. The driving current $I_{oled}$ flows from the second power supply terminal V2 to the first power supply terminal V1 via the driving transistor M0 and the light emitting diode OLED.

The photosensitive circuit PSC is connected between the second node n2 and a third node n3. The second node n2 is configured to receive the reference voltage V0. The photosensitive circuit PSC is configured to sense an intensity of light emission of the light emitting diode OLED. The photosensitive circuit PSC is further configured to set a potential at the third node n3 according to the reference voltage V0 and the sensed intensity.

In this exemplary embodiment, the photosensitive circuit PSC includes a photodiode PD connected between the second node n2 and the third node n3, and a first capacitor C0 connected between the second node n2 and the third node n3. The photodiode PD may generate a photocurrent in response to the light emission from the light emitting diode OLED, which photocurrent charges the first capacitor C0 to establish a voltage V' across the first capacitor C0. A potential $V_{n3}$ at the third node n3 is thus equal to the reference voltage V0 plus the established voltage V'. Thus, the potential $V_{n3}$ at the third node n3 can indicate the intensity of the light emission of the light emitting diode OLED. In some examples, the reference voltage V0 may have a fixed potential (e.g., equal to ELVSS), and thus may be supplied by the power supply 108 shown in FIG. 1.

In the exemplary embodiment illustrated in FIG. 3, the pixel circuit 300 further includes a first transistor M1 configured to bring the gate G of the driving transistor M0 into conduction with the second node n2 in response to the first scan signal on the first scan line G1[n] being active. The first transistor M1 is used to set the gate voltage of the driving transistor M0 by transferring the reference voltage V0 applied to the second node n2 to the gate G of the driving transistor M0.

In this exemplary embodiment, the pixel circuit 300 further includes a second transistor M2 configured to bring the data line D[m] into conduction with the source of the driving transistor M0 in response to the first scan signal on the first scan line G1[n] being active. The second transistor M2 is used to set the source voltage of the driving transistor M0 by writing the data voltage on the data line D[m] to the source of the driving transistor M0.

In this exemplary embodiment, the pixel circuit 300 further includes a third transistor M3 configured to bring the third node n3 into conduction with the sense line S[m] in response to the second scan signal on the second scan line G2[n] being active. The third transistor M3 is used to expose the potential at the third node n3, which was set by the photosensitive circuit PSC, to an external detection circuit, namely, the detection circuit DETm in this example.

In this exemplary embodiment, the pixel circuit 300 further includes a second capacitor Cst connected between the gate G and the source of the driving transistor. The second capacitor Cst is used to store the data voltage supplied to the pixel circuit 300 via the data line D[m].

It will be understood that the phrase "a signal being active" as used herein means that the signal has such a potential that it can enable the associated transistor. For example, for an N-type transistor, the active potential is high, and for a P-type transistor, the active potential is low.

Figure 4:
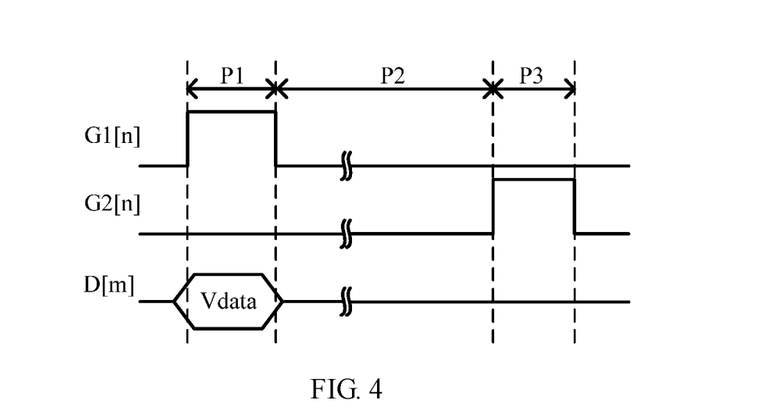
FIG. 4 is an exemplary timing diagram for the pixel circuit shown in FIG. 3.

FIG. 4 is an exemplary timing diagram for the pixel circuit 300 shown in FIG. 3. The operation of the pixel circuit 300 will be described below with reference to FIGS. 3 and 4.

At phase P1, a gate-source voltage across the gate G and the source of the driving transistor M0 is set. Specifically, the first scan signal on the first scan line G1[n] is active, the second scan signal on the second scan line G2[n] is inactive, and a data voltage Vdata is applied on the data line D[m]. The first transistor M1 is turned on and transfers the reference voltage V0 at the second node n2 to the gate G of the driving transistor M0. The second transistor M2 is turned on and transfers the data voltage Vdata on the data line D[m] to the source of the driving transistor M0. Thus, the gate voltage of the driving transistor M0 is set to the reference voltage V0, and the source voltage of the driving transistor M0 is set to the data voltage Vdata.

At phase P2, the driving transistor M0 controls the magnitude of the driving current $I_{oled}$ flowing through the light emitting diode OLED in response to the gate-source voltage. Specifically, both the first scan signal on the first scan line G1[n] and the second scan signal on the second scan line G2[n] are inactive, and the light emitting diode OLED emits light in response to the driving current $I_{oled}$ flowing through the light emitting diode OLED. In general, the driving current $I_{oled}$ can be expressed as:

$$I_{oled}=\tfrac{1}{2}K\times(Vgs-Vth)^2 \qquad (1)$$

where $$K = \frac{W}{L} \cdot C \cdot \mu,$$

μ is the carrier mobility of the driving transistor M0, C is the capacitance of the gate insulating layer of the driving transistor M0, W/L is the width-to-length ratio of the channel of the driving transistor M0, Vgs is the gate-source voltage of the driving transistor M0, and Vth is the threshold voltage of the driving transistor M0.

The photosensitive circuit PSC senses the intensity of light emission of the light emitting diode OLED. Specifically, the photodiode PD generates a photocurrent in response to the light emission of the light emitting diode OLED. The magnitude of the photocurrent is proportional to the intensity of the light emission of the light emitting diode OLED.

The photosensitive circuit PSC also sets a potential $V_{n3}$ at the third node n3 according to the reference voltage V0 and the sensed intensity. Specifically, the first capacitor C0 is charged with the photocurrent generated by the photodiode PD, thereby establishing a voltage V' across the first capacitor C0. As a result, the potential $V_{n3}$ at the third node n3 is equal to V0+V'.

At phase P3, the set potential $V_{n3}$ at the third node n3 is transferred to the sense line S[m]. Specifically, the first scan signal on the first scan line G1[n] is inactive, and the second scan signal on the second scan line G2[n] is active. The first and second transistors M1 and M2 are both turned off. The third transistor M3 is turned on and transfers the potential $V_{n3}$ at the third node n3 to the sense line S[m]. This potential $V_{n3}$ can then be detected by the detection circuit DETm shown in FIG. 1 and supplied to the timing controller 110. As previously described, the timing controller 110 will compensate the input image data RGBD based on the detected data DD from the plurality of detecting circuits DET1, DET2, . . . , DETm to generate compensated output image data RGBD'.

The pixel circuit 300 provides advantages over a configuration in which the pixel circuit and the photosensitive circuit are independent of each other. Specifically, for the pixel circuit 300, only one sense line S[m] is required, resulting in reduced routings. This means an increased aperture ratio for the pixel. Moreover, since separate electrical compensation is not required, the detection and processing circuitry for electrical compensation can be omitted, resulting in reduced cost. In particular, in exemplary embodiments in which the reference voltage V0 supplied to the second node n2 is equal to the power supply voltage ELVSS, the routings can be further reduced because the first power supply terminal V1 and the second node n2 can be powered via the same power supply line. It will be understood that the pixel circuit 300 is merely exemplary and that other embodiments are possible.

Figure 5:
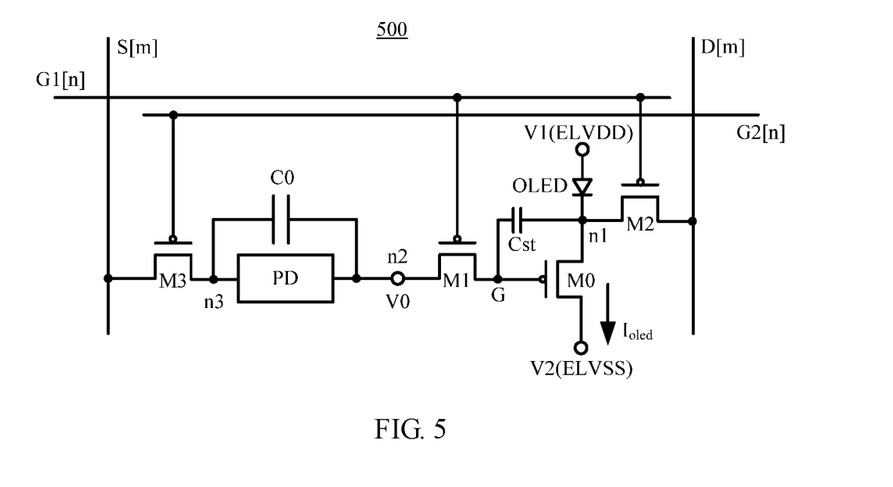
FIG. 5 is a schematic circuit diagram of a modification of the pixel circuit shown in FIG. 3.

FIG. 5 is a schematic circuit diagram of a modification 500 of the pixel circuit 300 shown in FIG. 3. The reference signs of FIG. 5 denote the same elements as those in FIG. 3.

The pixel circuit 500 differs from the pixel circuit 300 in that the driving transistor M0 is now a P-type transistor. Accordingly, the source of the driving transistor M0 is connected to the cathode of the light emitting diode OLED, and the anode of the light emitting diode OLED is connected to the first power supply terminal V1. In this case, the power supply voltage ELVDD is supplied to the first power source terminal V1, and the power supply voltage ELVSS is supplied to the second power source terminal V2. The driving current bled flows from the first power supply terminal V1 to the second power supply terminal V2 via the light emitting diode OLED and the driving transistor M0. In an exemplary embodiment, the reference voltage V0 supplied to the second node n2 may be equal to, for example, ELVDD, and thus may be supplied by the power supply 108 shown in FIG. 1.

In addition, in the example of FIG. 5, the first, second, and third transistors M1, M2, and M3 are also illustrated as P-type transistors, although this is not necessary. In the case of a P-type transistor, the active potential is low and the inactive potential is high.

The operation of the pixel circuit 500 is similar to that of the pixel circuit 300 described above with respect to FIG. 3, and is omitted herein for the sake of brevity.

While the present disclosure has been illustrated and described in detail in the drawings and the foregoing description, such illustration and description are to be regarded as illustrative and exemplary, rather than restrictive. The invention is not limited to the exemplary embodiments disclosed. Variations to the disclosed embodiments can be understood and effected by those skilled in the art from a study of the drawings, the disclosure and the appended claims. In the claims, the word "comprising" or "comprise" does not exclude other elements or steps, and the indefinite article "a" or "an" does not exclude a plurality. The mere fact that certain measures are recited in mutually different dependent claims does not indicate that the combination of these measures cannot be used to advantage.

What is claimed is:

1. A pixel circuit, comprising:
    an organic light emitting diode connected between a first node and a first power supply terminal;
    a driving transistor comprising a gate, a source connected to the first node, and a drain connected to a second power supply terminal; and
    a photosensitive circuit connected between a second node and a third node, the second node configured to receive a reference voltage,
    wherein the driving transistor is configured to, responsive to a gate voltage at the gate and a source voltage at the source, control a magnitude of a driving current flowing through the organic light emitting diode, the gate voltage being controllable to be equal to the reference voltage received at the second node, the source voltage being controllable to be equal to a data voltage supplied to the pixel circuit via a data line, and
    wherein the photosensitive circuit is configured to sense an intensity of light emission of the organic light emitting diode and to set a potential at the third node according to the reference voltage and the intensity that was sensed, the potential that was set being detectable by an external circuit via a sense line.

2. The pixel circuit of claim 1, further comprising:
    a first transistor configured to bring the gate of the driving transistor into conduction with the second node in response to a first scan signal on a first scan line being active; and
    a second transistor configured to bring the source of the driving transistor into conduction with the data line in response to the first scan signal on the first scan line being active.

3. The pixel circuit of claim 1, wherein the photosensitive circuit comprises:
    a photodiode connected between the second node and the third node; and
    a first capacitor connected between the second node and the third node.

4. The pixel circuit of claim 3, further comprising a third transistor configured to bring the third node into conduction with the sense line in response to a second scan signal on a second scan line being active.

5. The pixel circuit of claim 1, further comprising a second capacitor connected between the gate and the source of the driving transistor.

6. A display panel, comprising:
    a plurality of pixels arranged in an array,
    wherein each of the plurality of pixels comprises the pixel circuit of claim 1.

7. The display panel of claim 6, wherein each of the plurality of pixels further comprises:
    a first transistor configured to bring the gate of the driving transistor into conduction with the second node in response to a first scan signal on a first scan line being active; and
    a second transistor configured to bring the source of the driving transistor into conduction with the data line in response to the first scan signal on the first scan line being active.

8. The display panel of claim 6, wherein the photosensitive circuit comprises:
    a photodiode connected between the second node and the third node; and
    a first capacitor connected between the second node and the third node.

9. The display panel of claim 8, wherein each of the plurality of pixels further comprises a third transistor configured to bring the third node into conduction with the sense line in response to a second scan signal on a second scan line being active.

10. The display panel of claim 6, wherein each of the plurality of pixels further comprises a second capacitor connected between the gate and the source of the driving transistor.

11. A display device, comprising:
a first scan driver configured to sequentially supply a first scan signal to a plurality of first scan lines;
a second scan driver configured to sequentially supply a second scan signal to a plurality of second scan lines;
a data driver configured to generate data voltages based on image data and supply the data voltages that were generated respectively to a plurality of data lines;
a display panel comprising a plurality of pixel circuits arranged in an array, each of the plurality of pixel circuits comprising:
an organic light emitting diode connected between a first node and a first power supply terminal;
a driving transistor comprising a gate, a source connected to the first node, and a drain connected to a second power supply terminal; and
a photosensitive circuit connected between a second node and a third node, the second node configured to receive a reference voltage,
wherein the driving transistor is configured to, responsive to a gate voltage at the gate and a source voltage at the source, control a magnitude of a driving current flowing through the organic light emitting diode, the gate voltage being controllable to be equal to the reference voltage received at the second node, the source voltage being controllable to be equal to a corresponding one of the data voltages supplied to the pixel circuit via a corresponding one of the plurality of data lines, and
wherein the photosensitive circuit is configured to sense an intensity of light emission of the organic light emitting diode and to set a potential at the third node according to the reference voltage and the intensity that was sensed, the potential that was set at the third node being transferred to a corresponding one of a plurality of sense lines;
a plurality of detection circuits configured to detect respective ones of the potentials that were set, which are transferred by respective ones of the plurality of sense lines; and
a timing controller configured to control the first and second scan drivers, the data driver, and the plurality of detection circuits, wherein the timing controller is further configured to compensate image data to be supplied to the data driver based on detection by the plurality of detection circuits.

12. The display device of claim 11, wherein each of the plurality of pixel circuits further comprises:
a first transistor configured to bring the gate of the driving transistor into conduction with the second node in response to the first scan signal on a corresponding one of the plurality of first scan lines being active; and
a second transistor configured to bring the source of the driving transistor into conduction with the corresponding one of the plurality of data lines in response to the first scan signal on the corresponding one of the plurality of first scan lines being active.

13. The display device of claim 12, wherein each of the plurality of pixel circuits further comprises a second capacitor connected between the gate and the source of the driving transistor.

14. The display device of claim 11, wherein the photosensitive circuit comprises:
a photodiode connected between the second node and the third node; and
a first capacitor connected between the second node and the third node.

15. The display device of claim 14, wherein each of the plurality of pixel circuits further comprises a third transistor configured to bring the third node into conduction with the corresponding one of the plurality of sense lines in response to the second scan signal on a corresponding one of the plurality of second scan lines being active.

16. The display device of claim 15, wherein each of the plurality of pixel circuits further comprises a second capacitor connected between the gate and the source of the driving transistor.

17. The display device of claim 14, wherein each of the plurality of pixel circuits further comprises a second capacitor connected between the gate and the source of the driving transistor.

18. The display device of claim 11, wherein each of the plurality of pixel circuits further comprises a second capacitor connected between the gate and the source of the driving transistor.

19. A method of driving a pixel circuit, wherein the pixel circuit comprises: an organic light emitting diode connected between a first node and a first power supply terminal; a driving transistor comprising a gate, a source connected to the first node, and a drain connected to a second power supply terminal; and a photosensitive circuit connected between a second node and a third node, wherein the second node is configured to receive a reference voltage, the method comprising:
setting a gate voltage at the gate of the driving transistor to the reference voltage received at the second node;
setting a source voltage at the source of the driving transistor to a data voltage supplied to the pixel circuit via a data line;
responsive to the gate voltage and the source voltage, controlling, by the driving transistor, a magnitude of a driving current flowing through the organic light emitting diode;
sensing, by the photosensitive circuit, an intensity of light emission of the organic light emitting diode; and
setting, by the photosensitive circuit, a potential at the third node according to the reference voltage and the intensity that was sensed.

20. The method of claim 19, further comprising transferring the potential that was set at the third node to a sense line.

* * * * *